United States Patent [19]

Snyder et al.

[11] Patent Number: 4,749,878

[45] Date of Patent: Jun. 7, 1988

[54] INPUT DEVICE FOR CONTROL SYSTEM

[75] Inventors: Wayne E. Snyder, Montrose; Michael Michalchik, Newport Beach; Peter T. Cunningham, Pasadena, all of Calif.

[73] Assignee: Advanced Micro-Matrix, Inc., Altadena, Calif.

[21] Appl. No.: 927,845

[22] Filed: Nov. 6, 1986

[51] Int. Cl.[4] ............... H03M 1/00; H03K 11/00; H03K 17/94

[52] U.S. Cl. ...................... 307/308; 307/119; 377/16; 377/42; 377/45; 331/65; 328/1

[58] Field of Search ............ 307/116, 119, 308, 608; 377/17, 16, 42, 45; 368/112; 361/203; 331/65; 328/1

[56] References Cited

U.S. PATENT DOCUMENTS

| | | | |
|---|---|---|---|
| 3,643,418 | 2/1972 | Polin et al. | 368/188 |
| 3,843,873 | 10/1974 | Beville et al. | 377/42 |
| 3,986,003 | 10/1976 | Pruessner | 377/45 |
| 4,079,269 | 3/1978 | Numata et al. | 307/308 |
| 4,265,395 | 5/1981 | Sumikawa et al. | 377/45 |
| 4,387,307 | 6/1983 | D'Antonio | 307/119 |
| 4,549,098 | 10/1985 | Fushiki | 377/45 |

Primary Examiner—John S. Heyman
Attorney, Agent, or Firm—Christie, Parker & Hale

[57] ABSTRACT

A variable force push button is used as an input device for a control system. Specifically, a bi-directional storage device produces a command that is applied to an element to be controlled. A signal is generated having a characteristic representative of the force applied to the push button. A representation of the characteristic is integrated by the storage device. In addition to changing the characteristic by varying the force applied to the push button, the user can change the direction of the integration, thereby increasing and decreasing the value of the command. The push button comprises a pressure sensitive element sandwiched between electrically conductive contacts one of which is actuated by the user. The pressure sensitive element is constructed of conductive particles in an elastomeric matrix. Preferably, electrically conductive micro-agglomerates of unbound finely divided electro-conductive carbon particles having a maximum dimension of between about 0.1 and about 10 microns are enclosed by a matrix of elastomeric material and finely divided electro-conductive carbon particles bound together by the elastomeric material.

20 Claims, 4 Drawing Sheets

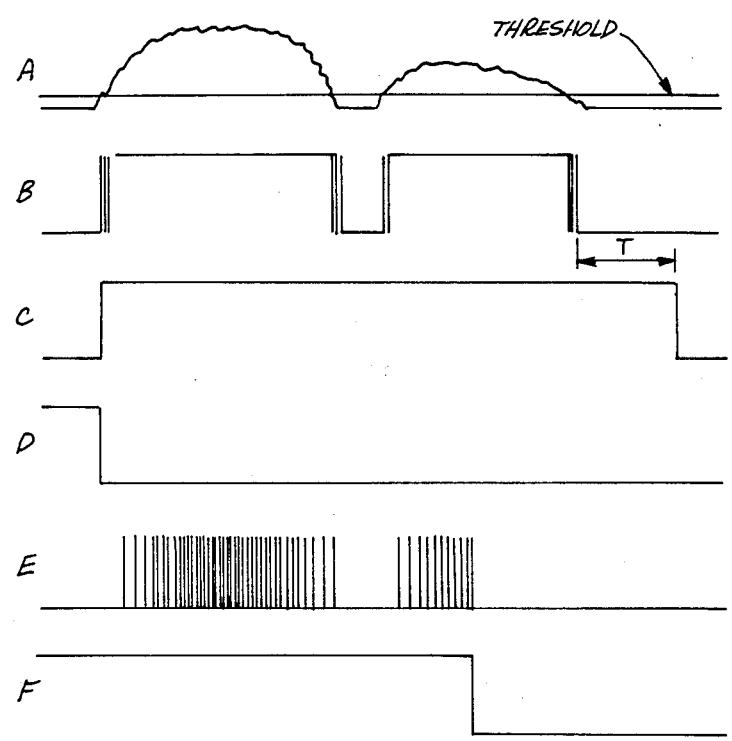

INPUT DEVICE FOR CONTROL SYSTEM

BACKGROUND OF THE INVENTION

This invention relates to control systems and, more particularly, to a user friendly input device for issuing commands to a control system.

By and large, push buttons are binary in nature, i.e., ON or OFF. When employed as an input device to issue commands to a control system, a binary push button offers the user only one variable, namely the ON time. When the push button is depressed, an analog or digital signal having constant characteristics is applied as the command to the control system.

U.S. Pat. No. 3,643,418, which issued on Feb. 22, 1972 to H. S. Polin, et al., discloses a time-setting device for an electronic watch in which a spring biased push button produces a signal having a characteristic representative of applied force. Thus, there are two variables that contribute to the command—namely, force and time. The push button of Polin, et al., controls the frequency of an oscillator such that the greater the applied force, the smaller is the frequency. The oscillator output is coupled to a counting device to count unidirectionally the pulses generated by the oscillator.

U.S. Pat. No. 3,843,873 which issued Oct. 22, 1974 to R. E. Beville, et al., discloses a counter having selective direction and a voltage to frequency convertor that feeds the counter variable rate control. The count of the counter is set by a rotatable spring biased control knob. A voltage is generated proportional to the torque applied to the control knob. This voltage is converted to pulses of related frequency which are applied to the counter. When the control knob is turned in one direction, the counter is incremented; in the other direction, the counter is decremented.

SUMMARY OF THE INVENTION

According to the invention, a variable force push button is used as an input device for a control system. Specifically, a bi-directional storage device produces a command that is applied to an element to be controlled. A signal is generated having a characteristic representative of the force applied to the push button. A representation of the characteristic is integrated by the storage device. In addition to changing the characteristic by varying the force applied to the push button, the user can change the direction of the integration, thereby increasing and decreasing the value of the command.

A feature of the invention is the generation of a signal having a characteristic, e.g., frequency, directly related to the force applied to the push button, i.e. the characteristic increases as the applied force increases. Another feature of the invention is a depressible push button comprising a pressure sensitive element sandwiched between electrically conductive contacts one of which is actuated by the user. The pressure sensitive element is constructed of conductive particles in an elastomeric matrix. Preferably, electrically conductive micro-agglomerates of unbound finely divided electro-conductive carbon particles having a maximum dimension of between about 0.1 and about 10 microns are enclosed by a matrix of elastomeric material and finely divided electro-conductive carbon particles bound together by the elastomeric material.

BRIEF DESCRIPTION OF THE DRAWINGS

The features of specific embodiments of the best mode contemplated of carrying out the invention are illustrated in the drawings, in which:

FIG. 6B is a diagram representing the signals at points A to F in FIG. 6A.

DETAILED DESCRIPTION OF THE SPECIFIC EMBODIMENTS

Figure 1:
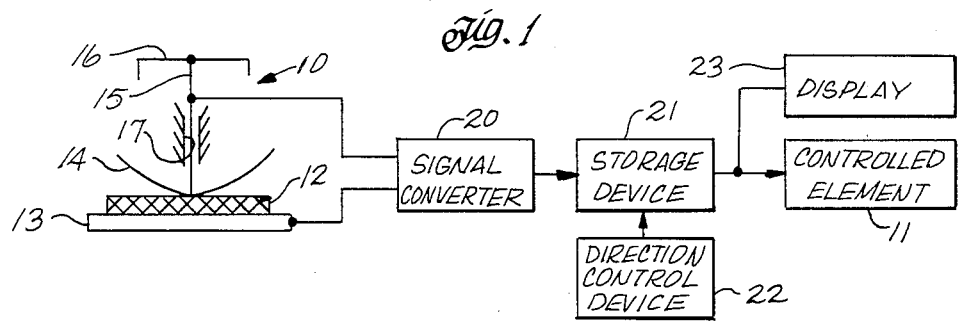
FIG. 1 is a schematic, partially blocked diagram of a control system including an input device incorporating principles of the invention.

Throughout the drawings, the same reference numerals are used to identify like elements.

In FIG. 1, a control system comprises a push button 10, which is operated by a user to issue commands to a controlled element 11. Push button 10 has a sheet of pressure sensitive material 12 sandwiched between an electrically conductive terminal 14 and a movable, electrically conductive terminal 14. Terminal 14 is connected by a shaft 15 to a finger receiving element 16, which is depressed by the user. A guide represented at 17 serves to confine shaft 15 to axial motion. Shaft 15 and element 16 are preferably electrically insulative. If desired, terminal 14 could be spring biased to hold it from contact with sheet 12 and to provide a force threshold above which push button 10 generates a force representative signal.

The extent of displacement of terminal 14 when element 16 is depressed, depends upon the characteristics of sheet 12. Preferably sheet 12 is made from electrically conductive micro-agglomerates of unbound, finely divided, electro conductive carbon particles having a maximum dimension between about 0.1 and about 10 microns. The particles are enclosed by a matrix of elastomeric material and finely divided electro conductive carbon particles bound together by the elastomeric material. The resulting pressure sensitive material has a non-linear, inversely related resistance-force characteristic, the rate of change of resistance decreasing with increasing force. For a further description of the resistance-force characteristic the composition and the method of making the preferred material for sheet 12, reference is made to co-pending application Ser. No. 809,075, filed Dec. 16, 1985, of Michael Michalchik and assigned to the assignee of the present application.

Although the described variable resistance push button construction is preferred, the principles of the invention can be practiced with other push button designs from which a force representative signal can be generated.

Terminals 13 and 14 are connected to the inputs of a signal converter 20, which produces an electrical signal having a characteristic, e.g., frequency or signal amplitude, that is directly related, preferably proportional, to the force applied to material 12 via terminal 14 by the user of push button 10. Signal converter 20 is coupled to a bi-directional storage device 21 for integrating the characteristic as a function of time. Storage device 21 generates a command signal having a characteristic representative of the integration. A direction control device 22 is coupled to storage device 21 to change the direction of integration of the characteristic. Storage device 21 is coupled to controlled element 11 to exercise control thereover, responsive to the command signal. Storage device 21 is also coupled to an optional digital or analog display 23 so the user can see the value of the command signal at all times. If the signal characteristic of signal converter 20 is, for example, pulse frequency, storage device 21 is a bi-directional binary counter that generates as the control signal the pulse count in digital form. In this case, direction control device 22 changes the direction of the counting operation, i.e., incrementing or decrementing. If the signal characteristic of signal converter 20 is electric current amplitude, storage device 21 is a capacitive circuit charged by the current to a voltage, the amplitude of which serves as analog command signal. In this case, direction control device 22 changes the polarity of the charging current provided by signal converter 20.

In general, storage device 21 can take various forms in addition to a hardware digital counter and an analog capacitor as discussed above. One important alternative would be a computer, (typically a microprocessor or a microcontroller) software counter. It would directly replace the described hardware counter. The output circuitry described below in connection with FIG. 4A, could be directly connected to the computer which in typical applications, would control the display and controlled element. Another alternative would be a stepper motor with a conventional pulse to stepper translation circuit. A stepper motor would be directly analogous to the bi-directional hardware counter except the output would be shaft positioned instead of parallel digital numbers. In this scheme, the stepper motor serves both as the storage device and the controlled element.

By way of example, controlled element 11 can be the cursor of a video display terminal, which can also serve as display 23. Exemplary applications of the invention are as follows:
  manual positioning for a numerically controlled machine tool;
  channel selecting for AM and FM radio;
  time setting for a digital clock;
  temperature setting for a microwave oven;
  volume control for a knobless stereo receivor;
  brightness control for a light dimmer;
  variable forward and reverse control for a VCR; and
  speed control for a conveyor belt.

Figure 2:
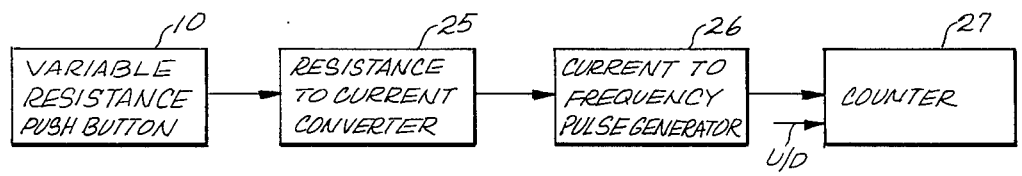
FIG. 2 is a schematic block diagram of a digital implementation of an input device according to the invention.

FIG. 2 illustrates a block diagram of circuitry for generating a digital command signal. The variable resistance of push button 10 is part of the circuit of a resistance to current convertor 25. The output of converter 25 is preferably a current inversely proportional in amplitude to the resistance of push button 10. Converter 25 is coupled to a current to frequency pulse generator 26 which generates pulses, preferably proportional in frequency to the amplitude of the current produced by converter 25. Pulse generator 26 is coupled to the counting input of a counter 27 to register, i.e., integrate the pulses produced by pulse generator 26. Counter 27 also has a direction controlling input designated U/D.

Figure 3:
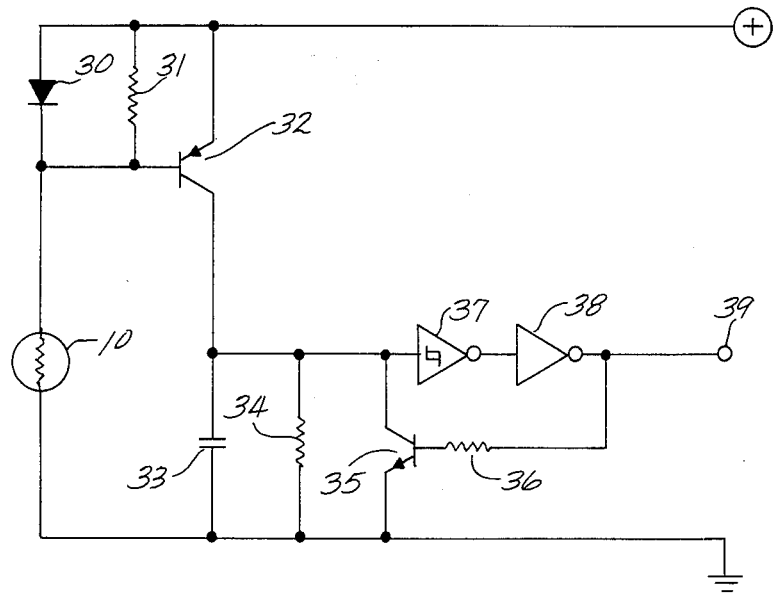
FIG. 3 is a schematic circuit diagram of one embodiment of the resistance to current converter and a current to frequency pulse generator of FIG. 2.

FIG. 3 illustrates the preferred circuit implementation of converter 25 and pulse generator 26 for unidirectional operation. Converter 25 comprises a diode 30, a resistor 31 and a p-n-p transistor 32. Pulse generator 26 comprises capacitor 33, a resistor 34, an n-p-n transistor 35, a resistor 36, a Schmitt trigger 37 and an inverter 38. The function of resister 34 which has a high resistance value, is to discharge capacitor 33 when operation has ceased. Diode 30 and the terminals of push button 10 are connected in series between a source of positive bias voltage and ground. Diode 30 is poled in the forward direction. Resistor 31 and the emitter to base circuit of transistor 32 are connected in parallel with diode 30. Transistor 32 and capacitor 33 are connected in series between the bias source and ground with the emitter of transistor 32 connected to the bias source and the collector thereof connected to capacitor 33. Resistor 34 and the collector and emitter terminals of transistor 35 are connected in parallel with capacitor 33. Schmitt trigger 37 and invertor 38 are connected in tandem between the junction of capacitor 33 and the collector of transistor 32 and an output terminal 39. A feedback resistor 36 is connected between the output of inverter 38 and the base of transistor 35.

In operation, diode 30 impresses an approximately constant voltage across the resistance of push button 10. The current passing through diode 30 is an inverse function of the resistance of push button 10. As a result, the current through diode 30, which is mirrored by the current passing through transistor 32, is directly related, preferably proportional, to the force exerted on push button 10. Resistor 31 corrects for the finite resistance presented by push button 10 when no force is applied thereto. As a result, there is applied to capacitor 33 a charging current from the collector of transistor 32 which is zero for zero push button force and increases linearly with increasing push button force. When the voltage across capacitor 33 rises above the positive going threshold of Schmitt trigger 37, the output of inverter 38 goes high. As a result, transistor 35 turns on i.e., conducts, thereby discharging capacitor 33, until the voltage thereacross drops below the negative going threshold of Schmitt trigger 37. This causes the output of inverter 38 to go low, thereby turning transistor 35 off so that capacitor 33 can recharge and produce a pulse of short fixed duration at output terminal 39. When capacitor 33 again charges up to the positive going threshold of Schmitt trigger 37, the process is repeated. The larger the amplitude of the charging current supplied by transistor 32 to capacitor 33, the shorter is the period, and thus the larger is the frequency, of the pulses produced at output terminal 39.

Figure 4A:
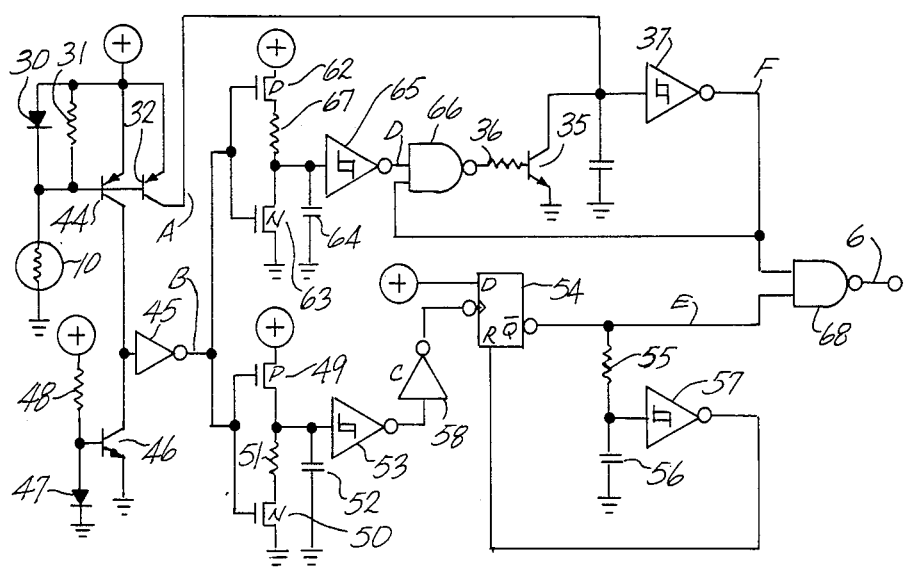
FIG. 4A is a schematic circuit diagram of an alternative to the embodiment of FIG. 3.

The alternative circuitry for unidirectional operation illustrated in FIG. 4A permits the user to generate one pulse each time the push button is depressed, i.e., one pulse per touch, independent of the push button force, followed by a series of pulses of force relates frequency, after the push button has been depressed for a given time period, e.g. one-half a second. The resistance to current converter has an additional output transistor 44 which is connected to a threshold detector comprising an inverter 45, an n-p-n transistor 46, a diode 47, and a resistor 48. Specifically, the emitter to base circuit of transistor 44 is connected in parallel with that of transistor 32 and the collector thereof is connected to the collector of transistor 46. The input of inverter 45 is connected to the junction of the collectors of transistors 44 and 46. The emitter of transistor 46 is connected to ground. A source of positive bias voltage is connected by resistor 48 to the base of transistor 46 and a diode 47 poled in the forward direction is connected between the base of transistor 46 and ground.

The output of inverter 45 is connected by a short delay circuit comprising a P-channel field effect transistor (FET) 49 and an N-channel FET 50, a resistor 51, a capacitor 52, and a Schmitt trigger 53 to a one-shot multivibrator comprising a flip-flop 54, a resistor 55, a capacitor 56, and a Schmitt trigger 57. The output of inverter 45 is connected to the control inputs of both FET 49 and FET 50. Capacitor 52 is connected between the input of Schmitt trigger 53 and ground. The end terminals of FET 50 and resistor 51 in series are also connected between the input of Schmitt trigger 53 and ground. The end terminals of FET 49 are connected between a source of positive bias voltage and the input of Schmitt trigger 53. The output of Schmitt trigger 53 is connected by an inverter 58 to the clock input of flip-flop 54. The D input of flip-flop 54 is connected to a source of positive bias voltage. The complementary output, Q, of flip-flop 54 is connected by resistor 55 to the input of Schmitt trigger 57, which, in turn, is connected by capacitor 56 to ground. The output of Schmitt trigger 57 is connected to the reset terminal, R, of flip-flop 54.

The output of inverter 45 is also connected by a delay circuit comprising a P-channel FET 62, an N-channel FET 63, a capacitor 64, a resistor 67 and a Schmitt trigger 65 to one input of an NAND circuit 66. The output of Schmitt trigger 37 is connected to the other input of NAND circuit 66. The output of NAND circuit 66 is connected to the base of transistor 35 to enable and disable the current to frequency pulse generator. The control terminals of both of FET 62 and FET 63 are connected to the output of inverter 45. A source of positive bias voltage is connected by the end terminals of FET 62 and a resistor 67 in series to the input of Schmitt trigger 65. Capacitor 64 is connected between the input of Schmitt trigger 65 and ground. The end terminals of FET 63 are also connected between the input of Schmitt trigger 65 and ground. The output of Schmitt trigger 65 is connected to the other input of NAND circuit 66. The output of Schmitt trigger 37 and the Q output of flip-flop 54 are connected to the inputs of an NAND circuit 68. The output of NAND circuit 68 is connected to an output terminal 69 to which the counting input of the counter is connected.

Figure 4B:
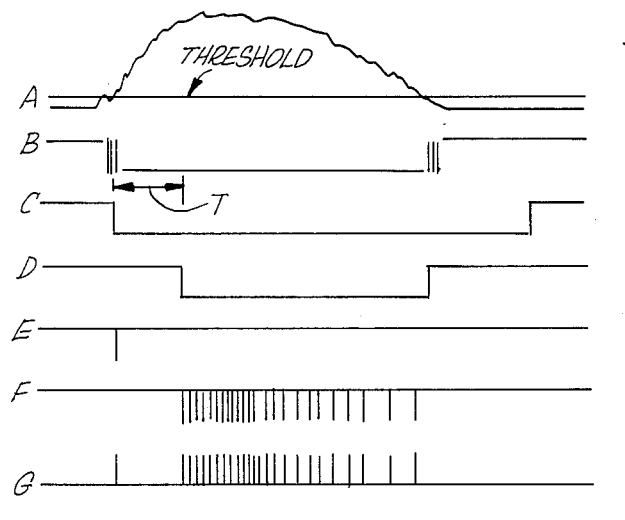
FIG. 4B is a diagram representing the signals at points A to G in FIG. 4A.

With reference to FIG. 4B, the circuitry of FIG. 4A operates as follows. Below a threshold value of force applied to push button 10, the input of inverter 45 is clamped by transistor 46 to a low binary value, the output of inverter 45 is high, FET 50 and FET 63 are turned on, i.e., conducting and FET 49 and FET 62 are turned off, i.e., non-conducting. As a result, capacitor 52 is discharged, the output of Schmitt trigger 53 is high, the Q output of flip-flop 54 is high. Further, capacitor 64 is discharged, the output of Schmitt trigger 65 is high, the output of NAND circuit 66 is high, transistor 35 is turned on, capacitor 33 is clamped to ground, the output of Schmitt trigger 37 is high, and output terminal 69 is low. Wave form A of FIG. 4B represents the force applied to push button 10 and the current generated at the collector of transistor 32 relative to the threshold set by transistor 46. When the applied force exceeds the threshold, the input of inverter 45 goes high and the output thereof goes low. As a result, FET 50 and FET 63 become non-conducting and FETs 49 and 62 become conducting, thereby charging capacitors 52 and 64. The output of inverter 45 is represented by wave form B in FIG. 4B. Capacitor 52 charges rapidly because of the low resistance path to the source of bias voltage and the output of Schmitt trigger 53 goes low as illustrated by wave form C. The output of inverter 53 goes high. This serves to trigger flip-flop 54, which causes the $\overline{Q}$ output to go low. As a result, capacitor 56 discharges and the output of Schmitt trigger 57 goes high, which serves to reset flip-flop 54. When flip-flop 54 is reset, capacitor 56 recharges and the output of Schmitt trigger 57 goes low. Consequently, a short pulse of duration determined by the time constant of resistor 55 and capacitor 56 is generated at the $\overline{Q}$ output of flip-flop 54, as represented by wave form E. Rapid changes in state of the output of inverter 45 as represented by wave form B in the vicinity of the original high to low transition are not transmitted to the output of Schmitt trigger 53, as illustrated by wave form C, because of the delay in the discharge of capacitor 52 attributable to resistor 51. Typically, the time constant of resistor 51 and capacitor 52 is such that force pulsations applied to push button 10 at an interval of 100 or 200 milliseconds or more result in separate pulses at output 69.

When FET 62 becomes conducting, as the force applied to push button 10 exceeds the threshold, resistor 67 delays the charging of capacitor 64 and thus the high to low drop of the output of Schmitt trigger 65, as illustrated by wave form D. This delay, typically of the order of one-half second, is represented as T in FIG. 4B. T is the given time period that push button 10 must be depressed before pulses related in frequency to the applied force are generated. When the output of Schmitt trigger 65 goes low, NAND circuit 66 is enabled. The output of NAND circuit 66 becomes high or low depending upon the output of Schmitt trigger 37, and the current to frequency pulse generator operates in the manner described above in connection with FIG. 3. The one pulse per touch from the Q output of flip-flop 54, as represented by wave form E, and the pulses of force related frequency from the output of Schmitt trigger 37, as illustrated by FIG. F, are combined by NAND circuit 68 and appear together at output terminal 69, as illustrated by wave form G.

Figure 5:
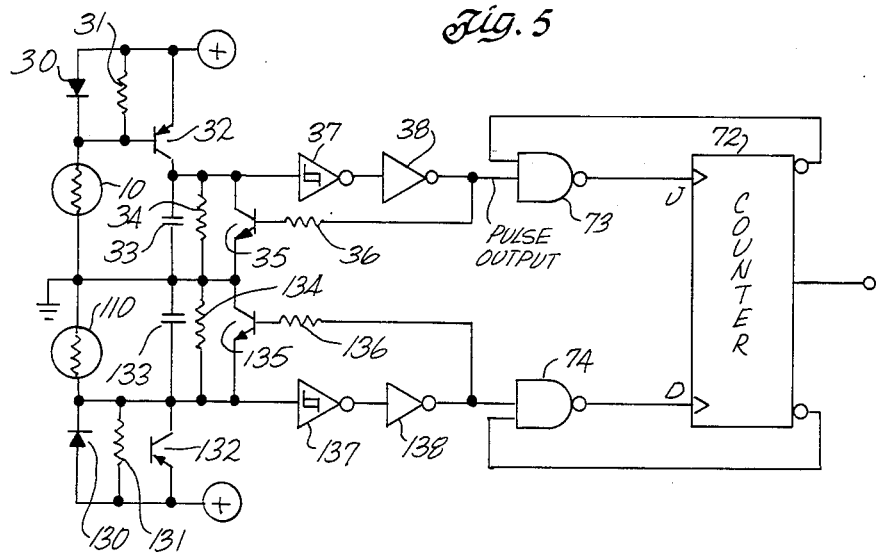
FIG. 5 is a schematic circuit diagram of another alternative to the embodiment of FIG. 3 with counter.

In FIG. 5 push button 10 is employed by the user to increment a counter 72 and another push button 110 is used to decrement counter 72 to achieve bi-directional operation. The variable resistance of push button 110 is connected to be part of a resistance to current converter comprising a diode 130, a resistor 131 and a p-n-p resistor 132 arranged to function in the same manner as the resistance to current convertor associated with push button 10. A current to frequency pulse generator comprises a capacitor 133, a resistor 134, an n-p-n transistor 135, a resistor 136, a Schmitt trigger 137 and an inverter 138 arranged to function in the same manner as the pulse generator associated with push button 10. The output of inverter 38 and the carry output, C, from counter 72 are connected to the inputs of a AND circuit 73. The output of NAND circuit 73 is connected to the incrementing input, U, of counter 72. The output of inverter 138 and the borrow output, B, of counter 72 are connected to the inputs of a NAND circuit 74. The output of NAND circuit 74 is connected to the decrementing input, D, of counter 72. The count registered by counter 72 is available in parallel form at an output terminal 75.

The user increments counter 72 by depressing push button 10 and decrements counter 72 by depressing push button 110. If counter 27 is incremented to its maximum value or decremented to its minimum value, e.g., zero, output C or B, as the case may be, goes low and further passage of pulses through AND circuit 73 or AND circuit 74, as the case may be, is blocked, thereby preventing counter 72 from recycling.

Figure 6A:
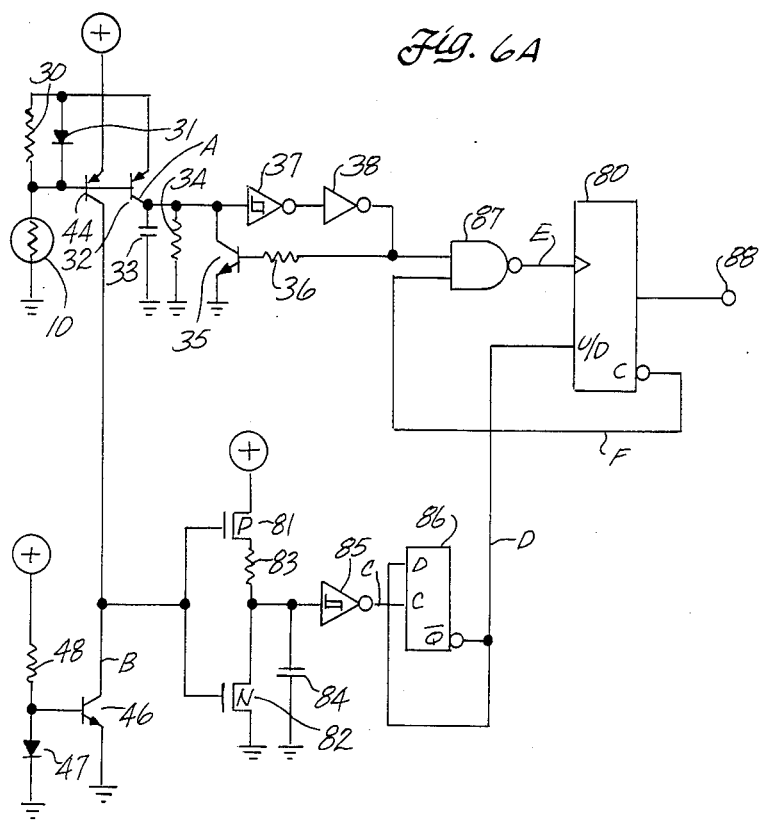
FIG. 6A is a schematic circuit diagram of still another alternative to the embodiment of FIG. 3 with counter.

In the arrangement of FIG. 6A, a counter 80 is alternately incremented and decremented on successive applications of force to pushbutton 10 to achieve bi-directional operation. A delay circuit comprises a P-channel FET 81 an N-channel FET 82, a resistor 83, a capacitor 84 and a Schmitt trigger 85. The control terminals of FET 81 and FET 82 are connected to the collector of transistor 46. The end terminals of FET 81 and resistor 83 in series are connected between a source of positive bias voltage and the input of Schmitt trigger 85. Capacitor 84 is connected between the input of Schmitt trigger 85 and ground. The end terminals of FET 82 are also connected between the input of Schmitt trigger 85 and ground. The output of Schmitt trigger 85 is connected to the clock input of a flip-flop 86. The complementary output, Q, of flip-flop 86 is connected to its D input and to a direction controlling input U/D of counter 80. The output of inverter 38 and the carry output C of counter 80 are connected to the inputs of a AND circuit 87. The output of AND circuit 87 is connected to the pulse counting input of counter 80. The count registered by counter 80 is available in parallel form at an output terminal 88.

In operation with reference to FIG. 6B, in the absence of application of force to push button 10, FET 81 is conducting, FET 82 is non-conducting, capacitor 84 is charged, and the output of Schmitt trigger 85 is low. When force is applied to push button 10, FET 81 turns off, FET 82 turns on and capacitor 84 is rapidly discharged. The output of Schmitt trigger 85 goes high, thereby triggering flip-flop 86. Each time flip-flop 86 is triggered by a low to high transition at the output of Schmitt trigger 85, the state of flip-flop 86 changes. Upon each change of state of flip-flop 86, the counting direction of counter 80 changes. Thus, flip-flop 86 functions as a frequency divider to reverse the counting direction each time push button 10 is depressed. The delay afforded by resistor 83 prevents unintentional changes in direction of counter 80 by requiring that the applications of force to push button 10 be separated by a predetermined interval, T, e.g. of the order of one second, set by the time constant of resistor 83 and capacitor 84, i.e. it serves to "debounce" push button 10. When the state of counter 80 reaches its maximum value, the C output of counter 80 goes low, thereby blocking further transmission thereto through AND circuit 87. As depicted by the wave forms in FIG. 6B, when push button 10 is depressed or released for a time duration less than the predetermined time interval T and then depressed again, the counting direction does not reverse and no pulses are generated between depressions of push button 10. The wave forms E and F depict the condition when the state of counter 80 reaches its maximum value.

In summary, as disclosed herein, the invention utilizes a variable resistance push button to bi-directionally set a command signal for an element to be controlled.

By way of example, the digital circuits could be CD 4000 series CMOS integrated circuit components, i.e. the Schmitt triggers could be CD40106 devices; the inverters could be CD 4069 devices; the flip-flops could be CD 4013 devices; the NAND circuits could be CD 4011; the AND gates could be CD 4081; the counter could be CD 40193 and/or 4516 devices; and the FETs could be DC 4007 devices. The transistors could be 2N4124 and 2N4126. The diodes could be 1N4001.

The described embodiments of the invention are only considered to be preferred and illustrative of the inventive concept; the scope of the invention is not to be restricted to such embodiments. Various and numerous other arrangements may be devised by one skilled in the art without departing from the spirit and scope of this invention. For example, other types of variable force push buttons could be employed and the invention is applicable to the generation of an analog command signal with an analog characteristic, e.g. current amplitude, and integrating device, e.g., a capacitor.

What is claimed is:

1. A control system comprising:
   a variable force depressible push button;
   means for generating a first electrical pulse signal having a varying pulse frequency directly related to the force applied to the push button;
   bi-directional storing means for counting the generated pulses to generate a command signal;
   means for changing the counting direction of the storing means;
   an element to be controlled; and
   means responsive to the command signal for controlling the element.

2. The control system of claim 1, in which the counting means is a digital counter to which the first pulse signal is applied to increment the counter responsive to each of said pulses.

3. The control system of claim 2, in which the counter is reversible and the changing means comprises:
   an additional depressible push button;
   means for generating a second electrical pulse signal having a pulse frequency representative of the force applied to the additional push button;
   and means for applying the second pulse signal to the counter to decrement the counter responsive to each of said pulses.

4. The control system of claim 2 in which the counter is reversible, and the changing means comprises:
   an additional depressible push button;
   means for generating a direction changing signal;
   and means for applying the direction changing signal to the counter to reverse its direction.

5. An input element to generate a command for a controlled element in a control system, the input element comprising:
   a variable force depressible push button;
   means for generating a varying signal having a characteristic directly related to the force applied to the push button;
   bi-directional storing means for integrating the characteristic as a function of time to generate a command;
   means for changing the direction of integration by the storing means; and
   means responsive to the storing means for displaying the command.

6. The input element of claim 5, in which the signal is a first electrical pulse signal, the characteristic is pulse frequency, and the storing means is a reversible digital counter to which the first pulse signal is applied to increment the counter responsive to each of said pulses.

7. The input element of claim 6, in which the changing means comprises:
an additional depressible push button;
means for generating a second electrical pulse signal having a pulse frequency representative of the force applied to the additional push button;
and means for applying the second pulse signal to the counter to decrement the counter responsive to each of said pulses.

8. The control system of claim 6, in which the changing means comprises:
an additional depressible push button;
means for generating a direction changing signal;
and means for applying the direction changing signal to the counter to reverse its direction.

9. The input element of claim 6, in which the push button has a force variable resistance and the generating means comprises:
a source of bias voltage;
a diode connected in series with the push button across the source to form a junction therebetween;
a transistor having an emitter, base and collector;
an oscillator having a pair of input terminals and a frequency directly dependent upon the current applied to the input terminals;
means for connecting the emitter and collector of the transistor and the input terminals of the oscillator in series across the source; and
means for connecting the base of the transistor to the junction.

10. The input element of claim 9, in which the oscillator comprises;
a capacitor connected across the input terminals
a pair of output terminals;
a Schmitt trigger connected between the input terminals and the output terminals;
a short circuiting transistor having an emitter base and collector;
means for connecting the emitter and collector of the short circuiting transistor across the capacitor; and
means for connecting the output of the Schmitt trigger to the base of the short circuiting transistor to alternately charge and discharge the capacitor.

11. The input element of claim 5, in which the changing means comprises means for alternately changing the direction of integration on successive depressions of the push button.

12. The input element of claim 11, in which the changing means comprises:
a flip-flop;
means for triggering the flip-flop each time the push button is depressed; and
means responsive to the state of the flip-flop for changing the direction of integration.

13. The input element of claim 6, in which the generating means generates a force representative signal only after the push button has been depressed for a predetermined time interval, the input element additionally comprising means for producing a single pulse each time the push button is depressed during the predetermined time interval.

14. The input element of claim 13, in which the generating means comprises means for generating electrical pulses having a frequency proportional to the force applied to the push button only after the push button has been depressed a predetermined time.

15. The input element of claim 5, in which the push button comprises a pressure sensitive element sandwiched between a stationary electrical contact and a movable electrical contact.

16. The control element of claim 15, in which the pressure sensitive element is constructed of conductive particles in an elastomeric matrix.

17. The control element of claim 16 in which the pressure sensitive element comprises electrically conductive micro-agglomerates of unbound finely divided electro-conductive carbon particles having a maximum of between about 0.1 and about 10 microns enclosed by a matrix of elastomeric material and finely divided electro-conductive carbon particles bound together by the elastomeric material.

18. A control system comprising:
a variable force depressible push button;
means for generating a first varying signal having a characteristic with a value directly related to the force applied to the push button only after the push button has been depressed for a predetermined time interval;
means for generating a second signal having a constant value of the characteristic independent of force each time the push button is depressed during the predetermined time interval;
bi-directional storing means responsive to either the first and second signals for integrating the values of the characteristic as a function of time to generate a command signal;
means for changing the direction of integration by the storing means;
an element to be controlled; and
means responsive to the command signal for controlling the element.

19. The control system of claim 18, in which the first and second signals are electrical pulse signals, the characteristic is pulse frequency, and the storing means is a digital counter to which the first pulse signal is applied to increment the counter responsive to each of said pulses.

20. The input element of claim 18, in which the first generating means comprises means for generating electrical pulses having a frequency proportional to the force applied to the push button only after the push button has been depressed a predetermined time interval and the second signal generating means generates one pulse during the predetermined time interval each time the push button is depressed.

* * * * *